United States Patent
Hirai et al.

(10) Patent No.: US 10,033,368 B2
(45) Date of Patent: Jul. 24, 2018

(54) TRANSMITTER AND TRANSMISSION/RECEPTION SYSTEM

(71) Applicant: THINE ELECTRONICS, INC., Tokyo (JP)

(72) Inventors: Yusaku Hirai, Tokyo (JP); Akihiro Moto, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 15/656,056

(22) Filed: Jul. 21, 2017

(65) Prior Publication Data

US 2018/0034454 A1 Feb. 1, 2018

(30) Foreign Application Priority Data

Jul. 29, 2016 (JP) .................................. 2016-149244

(51) Int. Cl.
*H03K 5/24* (2006.01)
*H03K 17/60* (2006.01)

(52) U.S. Cl.
CPC ............. *H03K 5/24* (2013.01); *H03K 17/603* (2013.01)

(58) Field of Classification Search
CPC ...... H03K 5/24; H03K 5/2418; H03K 5/2445; H03K 5/2481
See application file for complete search history.

(56) References Cited

U.S. PATENT DOCUMENTS

| 7,427,872 | B2 | | 9/2008 | Schoenborn et al. | |
|---|---|---|---|---|---|
| 7,620,121 | B1 | * | 11/2009 | Tetzlaff | H04L 25/0296 327/303 |
| 8,212,587 | B2 | * | 7/2012 | Yeung | H04B 3/36 326/82 |
| 9,306,609 | B1 | * | 4/2016 | LaCroix | H04B 3/548 |
| 9,942,677 | B2 | * | 4/2018 | Wiesbauer | H04R 29/004 |
| 2002/0130680 | A1 | * | 9/2002 | Meyer | H03K 19/0005 326/30 |
| 2006/0129733 | A1 | * | 6/2006 | Sobelman | H04L 25/0262 710/305 |
| 2010/0262877 | A1 | * | 10/2010 | Narayan | G01B 31/318572 714/727 |
| 2015/0349795 | A1 | * | 12/2015 | Coulon | H03F 3/45094 341/122 |
| 2018/0034455 | A1 | * | 2/2018 | Hirai | H03K 5/24 |
| 2018/0048312 | A1 | * | 2/2018 | Lung | H03K 19/018571 |

* cited by examiner

*Primary Examiner* — Thomas J Hiltunen
(74) *Attorney, Agent, or Firm* — Sughrue Mion, PLLC

(57) ABSTRACT

A transmitter includes: an output driver that outputs differential signals to differential signal lines; first termination resistors and a first switch which are provided in series between a first reference voltage input terminal to which a reference voltage is inputted and the differential signal lines; a pulse generator that outputs a common-mode pulse to the differential signal lines; a second switch provided between the differential signal lines and the pulse generator; a detector that detects, after generation of the common-mode pulse starts, timing at which a voltage level of the common-mode pulse exceeds a threshold; and a controller that places the second switch in an on state to connect the pulse generator to the differential signal lines, and powers down the output driver and then places the first switch in an off state to allow the pulse generator to output the common-mode pulse to the differential signal lines.

3 Claims, 11 Drawing Sheets

TRANSMITTER AND TRANSMISSION/RECEPTION SYSTEM

TECHNICAL FIELD

The present disclosure relates to a transmitter and a transmission/reception system.

BACKGROUND

U.S. Pat. No. 7,427,872 (Patent Document 1) and U.S. Pat. No. 8,212,587 (Patent Document 2) disclose inventions of transmitters and receivers that are capable of performing signal transmission conforming to the Universal Serial Bus (USB) 3.1 standard. The transmitters described in these documents are devices that transmit differential signals to a receiver via differential signal lines having AC coupling capacitors provided in the middle thereof, and have an RX-Detect function that detects whether the receiver is connected to the differential signal lines in a receivable state.

SUMMARY

The present inventors have found that, in the transmitters described in Patent Documents 1 and 2, a negative common-mode pulse may occur on the differential signal lines upon RX-Detect, and the negative common-mode pulse may destroy devices in the receiver.

The present disclosure describes a transmitter capable of suppressing the occurrence of a negative pulse upon RX-Detect, and a transmission/reception system including such a transmitter and a receiver.

A transmitter according to one aspect of the present disclosure is a transmitter that transmits differential signals to a receiver via differential signal lines having AC coupling capacitors provided in middle of the differential signal lines, and includes (1) an output driver configured to output the differential signals to the differential signal lines; (2) first termination resistors and a first switch, the first termination resistors and the first switch being provided in series between a first reference voltage input terminal and the differential signal lines, a reference voltage being inputted to the first reference voltage input terminal; (3) a pulse generator configured to output a common-mode pulse to the differential signal lines; (4) a second switch provided between the differential signal lines and the pulse generator; (5) a detector configured to detect, after generation of the common-mode pulse starts, timing at which a voltage level of the common-mode pulse exceeds a threshold; and (6) a controller configured to place the second switch in an on state to connect the pulse generator to the differential signal lines, and power down the output driver and then place the first switch in an off state to allow the pulse generator to output the common-mode pulse to the differential signal lines.

DETAILED DESCRIPTION

Description of an Embodiment of The Present Disclosure

First, an embodiment of the present disclosure is listed and described.

A transmitter according to one aspect of the present disclosure is a transmitter that transmits differential signals to a receiver via differential signal lines having AC coupling capacitors provided in middle of the differential signal lines, and includes (1) an output driver configured to output the differential signals to the differential signal lines; (2) first termination resistors and a first switch which are provided in series between a first reference voltage input terminal to which a reference voltage is inputted and the differential signal lines; (3) a pulse generator configured to output a common-mode pulse to the differential signal lines; (4) a second switch provided between the differential signal lines and the pulse generator; (5) a detector configured to detect, after generation of the common-mode pulse starts, timing at which a voltage level of the common-mode pulse exceeds a threshold; and (6) a controller configured to place the second switch in an on state to connect the pulse generator to the differential signal lines, and power down the output driver and then place the first switch in an off state to allow the pulse generator to output the common-mode pulse to the differential signal lines. The detector may be connected to only either one of the differential signal lines and may detect, after generation of the common-mode pulse starts, timing at which a voltage level of a pulse on the either one of the differential signal lines exceeds the threshold.

A transmission/reception system according to another aspect of the present disclosure includes the above-described transmitter; and a receiver connected to the transmitter by the differential signal lines. The receiver includes: an input buffer configured to accept, as input, differential signals arriving from the transmitter via the differential signal lines; and second termination resistors and a third switch which are provided in series between a second reference voltage input terminal to which a reference voltage is inputted and the differential signal lines.

According to the present disclosure, the occurrence of a negative pulse upon RX-Detect can be suppressed and thus the destruction of devices in a receiver caused by the negative pulse can be suppressed.

Detail of an Embodiment of The Present Disclosure

Specific examples of a transmitter and a transmission/reception system according to an embodiment of the present disclosure will be described below with reference to the drawings. Note that in the description of the drawings the same components are denoted by the same reference signs and overlapping description thereof is omitted. It is intended that the present invention is not limited to the exemplifications and all changes within the scope of the claims and their equivalents are included in the present invention.

Figure 1:
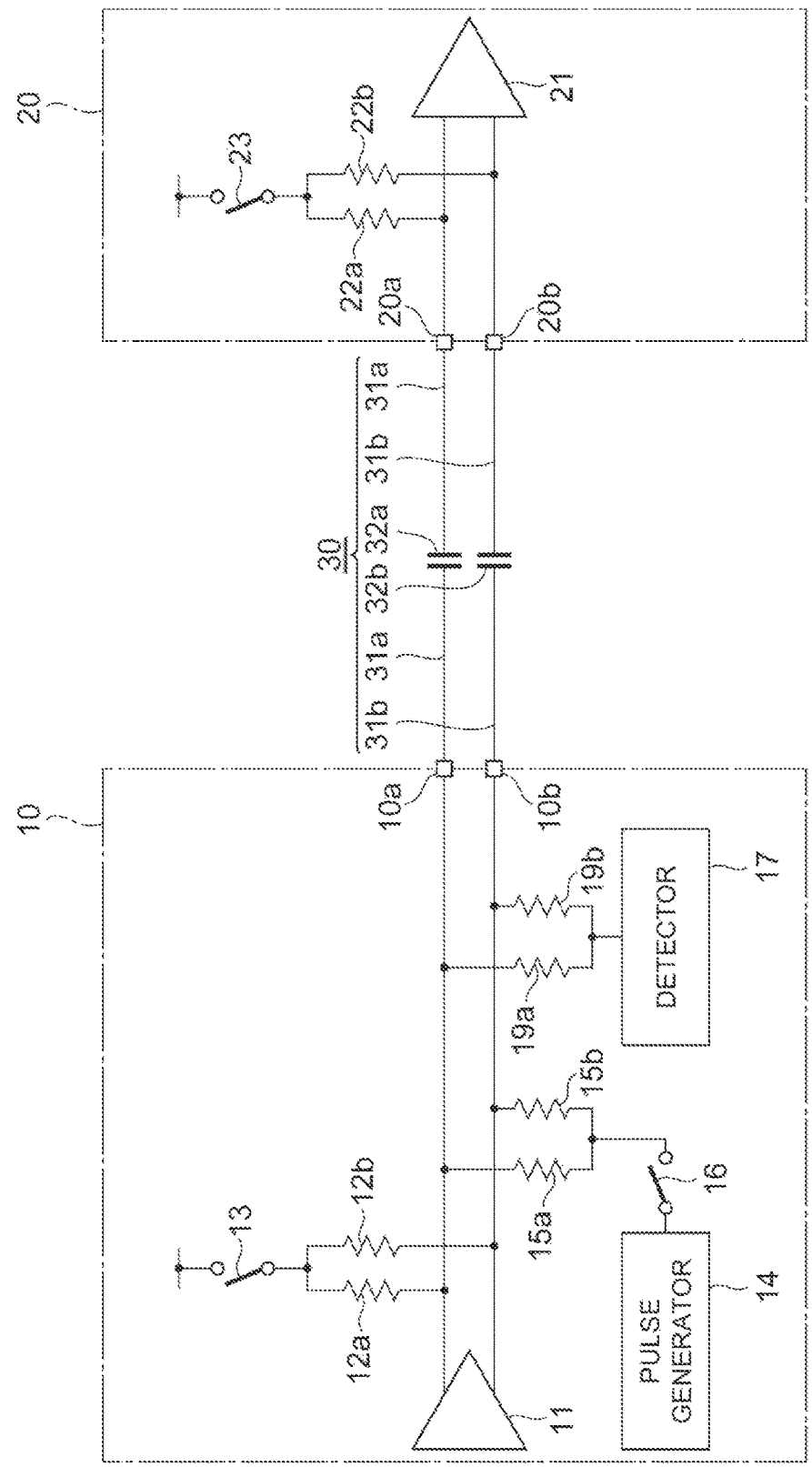
FIG. 1 is a diagram showing a schematic configuration of a transmission/reception system 1.

FIG. 1 is a diagram showing a schematic configuration of a transmission/reception system 1. The transmission/reception system 1 includes a transmitter 10 and a receiver 20. The receiver 20 is connected to the transmitter 10 by differential signal lines 30.

The differential signal lines 30 include a first signal 31a, a second signal line 31b, an AC coupling capacitor 32a, and an AC coupling capacitor 32b. The AC coupling capacitor 32a is provided in the middle of the first signal line 31a. The AC coupling capacitor 32b is provided in the middle of the second signal line 31b. The AC coupling capacitors 32a and 32b have a capacitance value of 75 nF to 265 nF.

The transmitter 10 includes output terminals 10a and 10b and is configured to transmit differential signals to the receiver 20 through the output terminals 10a and 10b via the differential signal lines 30. The transmitter 10 includes an output driver 11, termination resistors 12a and 12b (first termination resistors), a switch 13 (first switch), a pulse generator 14, and a detector 17. The output driver 11 is a circuit configured to output differential signals to be sent out to the differential signal lines 30.

The termination resistors 12a and 12b and the switch 13 are provided in series between a reference voltage input terminal (first reference voltage input terminal) to which a fixed reference voltage is inputted and the differential signal lines 30. Namely, the termination resistor 12a and the switch 13 are provided in series between the reference voltage input terminal and the first signal line 31a. The termination resistor 12b and the switch 13 are provided in series between the reference voltage input terminal and the second signal line 31b.

The pulse generator 14 and the detector 17 perform RX-Detect. The pulse generator 14 is a circuit configured to output a common-mode pulse to the differential signal lines 30 (each of the first signal line 31a and the second signal line 31b). The detector 17 is a circuit configured to detect, after generation of a common-mode pulse starts, timing at which the level (voltage level) of the common-mode pulse exceeds a threshold. Unlike differential signals outputted from the output driver 11, common-mode pulses outputted from the pulse generator 14 are of the same voltage on the first signal line 31a and the second signal line 31b. Therefore, the detector 17 may compare the voltage level of either one of the common-mode pulses on the first signal line 31a and the second signal line 31b with the threshold.

The receiver 20 includes input terminals 20a and 20b and is configured to receive differential signals arriving at the input terminals 20a and 20b from the transmitter 10 via the differential signal lines 30. The receiver 20 includes an input buffer 21, termination resistors 22a and 22b (second termination resistors), and a switch 23 (third switch). The input buffer 21 is a circuit configured to accept, as input, differential signals and perform processes such as amplification, distortion compensation, and waveform shaping on the inputted signals.

The termination resistors 22a and 22b and the switch 23 are provided in series between a reference voltage input terminal (second reference voltage input terminal) to which a fixed reference voltage is inputted and the differential signal lines 30. Namely, the termination resistor 22a and the switch 23 are provided in series between the reference voltage input terminal and the first signal line 31a. The termination resistor 22b and the switch 23 are provided in series between the reference voltage input terminal and the second signal line 31b.

The termination resistors 12a and 12b of the transmitter 10 and the termination resistors 22a and 22b of the receiver 20 are provided for high-speed transmission (e.g., 10 Gbps) and have a resistance value of, for example, 45Ω.

When the receiver 20 is not connected to the differential signal lines 30 and when, even if the receiver 20 is connected to the differential signal lines 30, the switch 23 is in an off state, the transmitter 10 determines, by RX-Detect performed by the pulse generator 14 and the detector 17, that the receiver 20 is not connected to the differential signal lines 30 in a receivable state. Then, in this case, the transmitter 10 stops the sending out of differential signals from the output driver 11 to power down the output driver 11, by which power consumption can be reduced.

Figure 2:
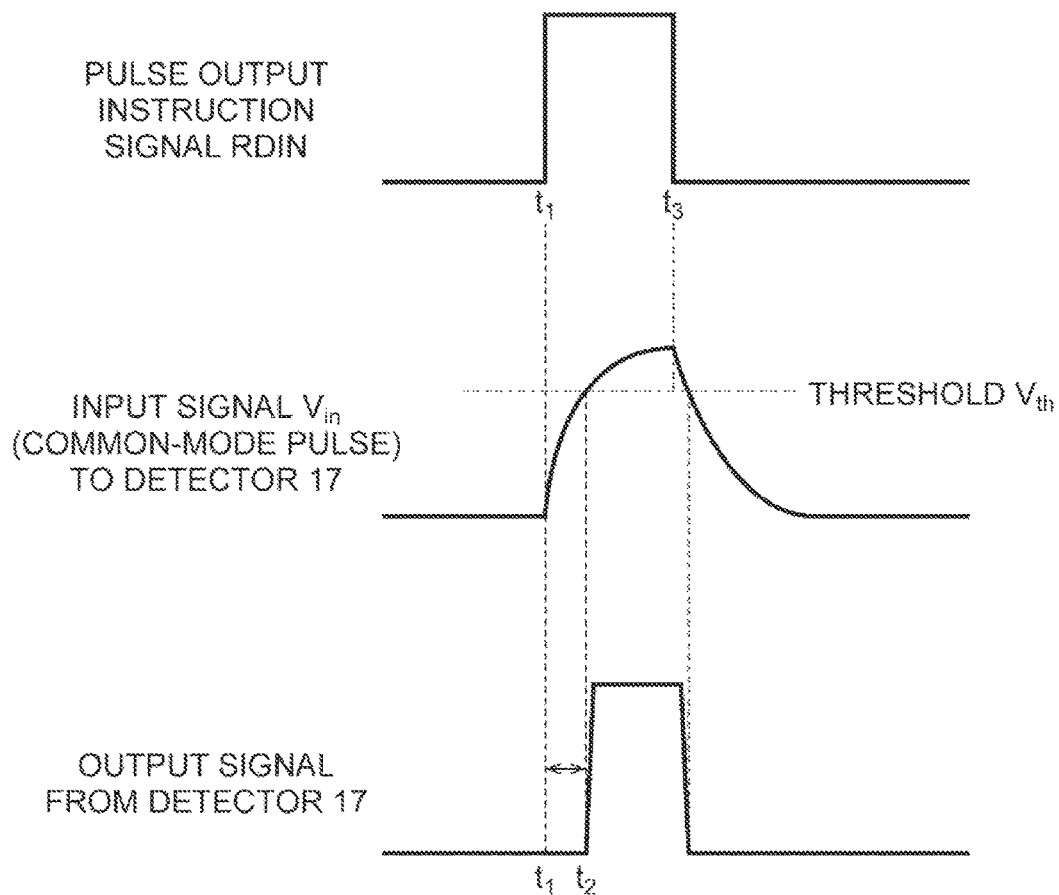
FIG. 2 is a timing chart describing RX-Detect performed by a pulse generator 14 and a detector 17 of a transmitter 10.

FIG. 2 is a timing chart describing RX-Detect performed by the pulse generator 14 and the detector 17 of the transmitter 10. When the transmitter 10 performs RX-Detect, the transmitter 10 first powers down the output driver 11 and places the switch 13 in an off state.

Thereafter, the pulse generator 14 outputs a common-mode pulse to the differential signal lines 30 during a period ($t_1$ to $t_3$) during which a pulse output instruction signal RDIN is at a significant level (high level). At this time, the voltage level of a signal inputted to the detector 17 increases at a speed according to a speed at which the AC coupling capacitors 32a and 32b (and parasitic capacitance) are charged. Namely, when the receiver 20 is not connected to the differential signal lines 30 in a receivable state, the AC coupling capacitors 32a and 32b are charged at high speed, and thus, the voltage level of a signal inputted to the detector 17 also increases rapidly. In contrast, when the receiver 20 is connected to the differential signal lines 30 in a receivable state, it takes time to charge the AC coupling capacitors 32a and 32b, and thus, the voltage level of a signal inputted to the detector 17 also increases slowly.

The detector 17 can determine whether the receiver 20 is connected to the differential signal lines 30 in a receivable state, by detecting, after time $t_1$ at which generation of the common-mode pulse starts, timing at which the voltage level of the common-mode pulse exceeds a threshold $V_{th}$. At this time, the detector 17 may determine a time period τ from time $t_1$ at which generation of the common-mode pulse starts until time $t_2$ at which the voltage level of the common-mode pulse exceeds the threshold $V_{th}$, and determine, by the length of the time period τ, whether the receiver 20 is connected to the differential signal lines 30 in a receivable state. Alternatively, the detector 17 may determine whether the receiver 20 is connected to the differential signal lines 30 in a receivable state, by determining whether the voltage level of the common-mode pulse exceeds the threshold $V_{th}$ at a time point at which a certain period of time has elapsed from time $t_1$ at which generation of the common-mode pulse starts.

Figure 3:
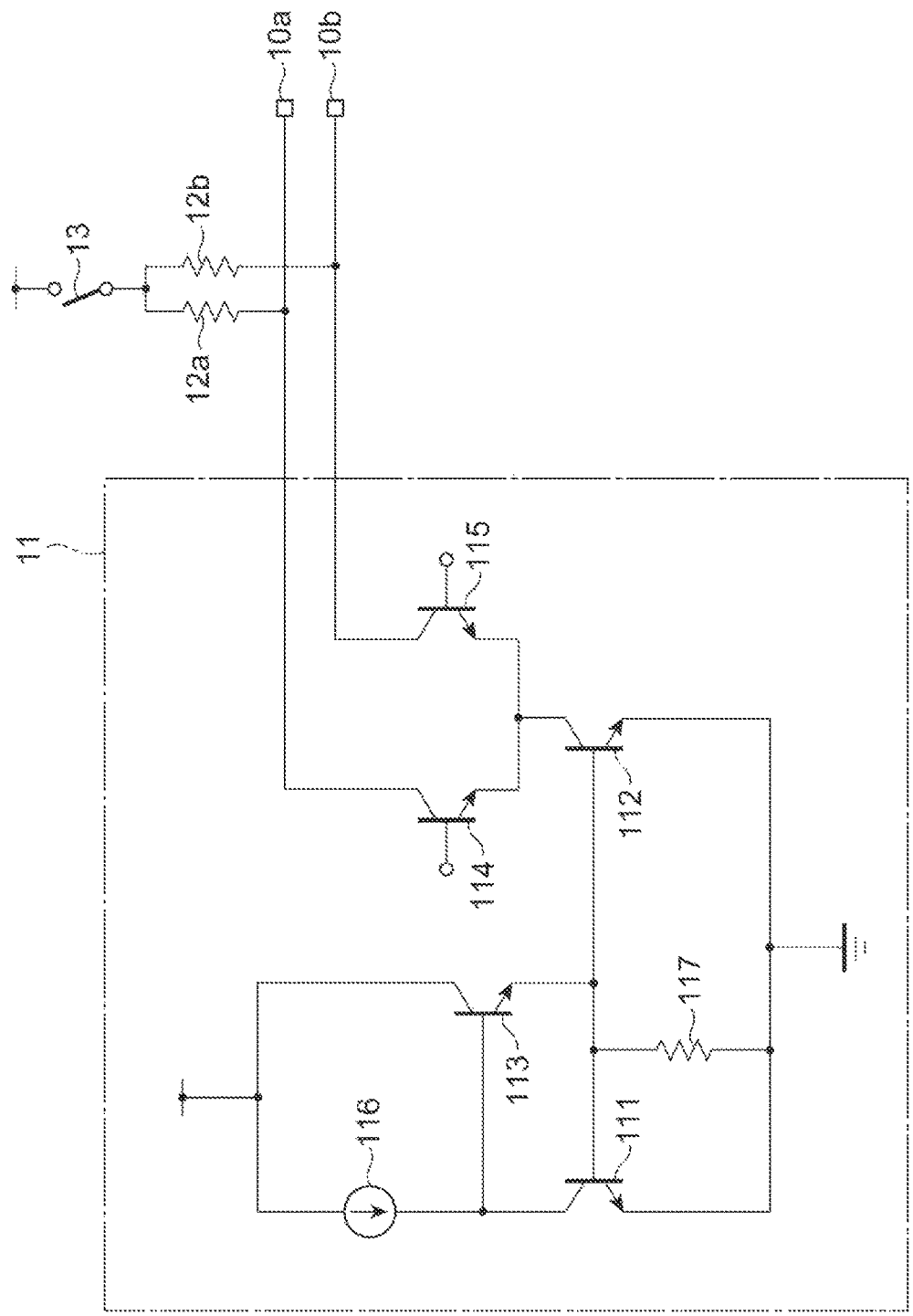
FIG. 3 is a diagram showing an exemplary circuit configuration of an output driver 11 of the transmitter 10.

FIG. 3 is a diagram showing an exemplary circuit configuration of the output driver 11 of the transmitter 10. The output driver 11 includes npn bipolar transistors 111 to 115, a constant current source 116, and a resistor 117.

The constant current source 116 is provided between a collector of the transistor 111, a base of the transistor 113, and a power supply voltage terminal. A collector of the transistor 113 is connected to the power supply voltage terminal. Emitters of the transistors 111 and 112 are connected to a ground voltage terminal. Bases of the transistors 111 and 112 are connected to an emitter of the transistor 113. The transistors 111 to 113 and the constant current source 116 form a current mirror circuit, by which a constant current can flow from the collector to emitter of the transistor 112. The resistor 117 is provided between the emitter of the transistor 113 and the ground voltage terminal.

Emitters of the transistors 114 and 115 are connected to the collector of the transistor 112. A collector of the transistor 114 is connected to the output terminal 10a. A collector of the transistor 115 is connected to the output terminal 10b. Differential signals are inputted to bases of the transistors 114 and 115, and signals obtained by amplifying the differential signals are outputted from the collectors of the transistors 114 and 115.

In general, an output driver composed of bipolar transistors has higher current driving strength than an output driver composed of MOS transistors, and thus is advantageous in terms of high-speed transmission. By placing the constant current source 116 in an off state, the output driver 11 can be powered down.

Figure 4:
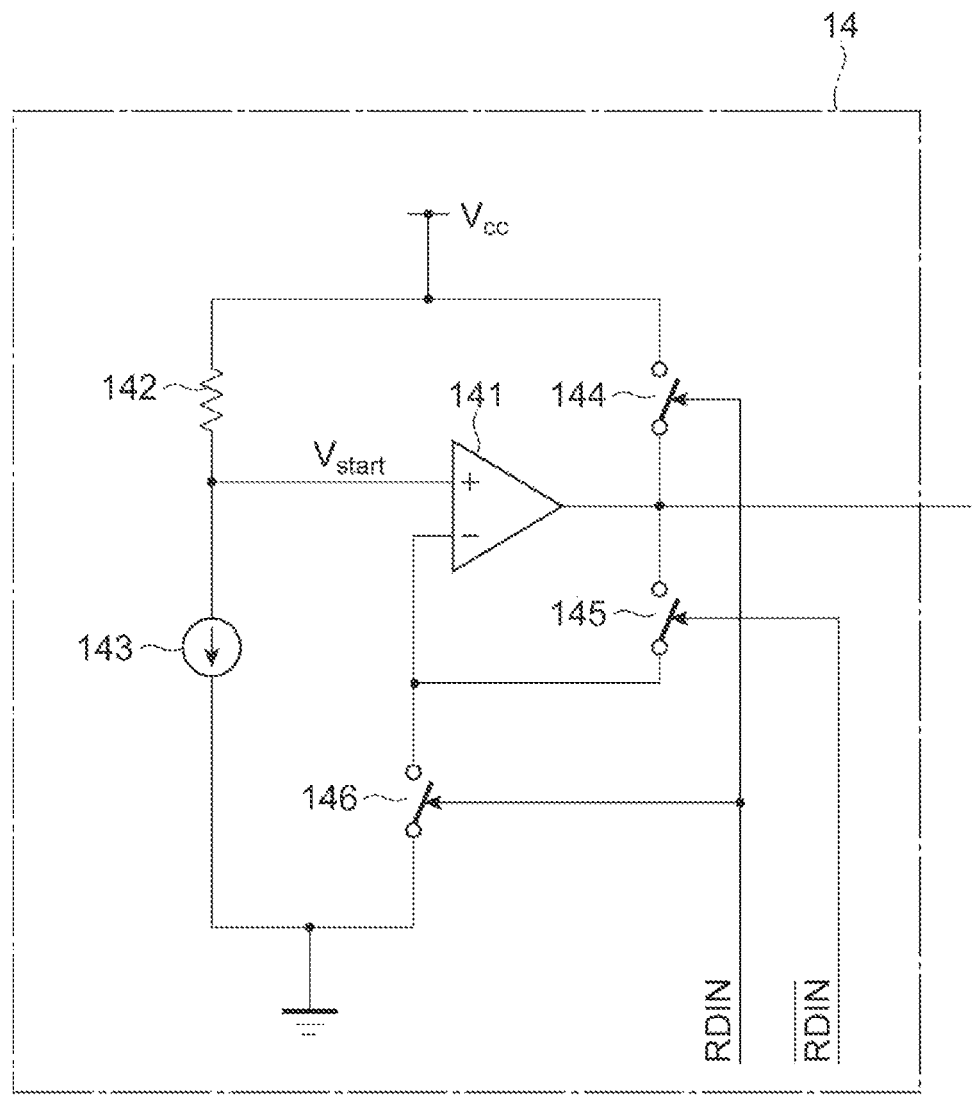
FIG. 4 is a diagram showing an exemplary circuit configuration of the pulse generator 14 of the transmitter 10.

FIG. 4 is a diagram showing an exemplary circuit configuration of the pulse generator 14 of the transmitter 10. The pulse generator 14 includes a differential amplifier 141, a resistor 142, a constant current source 143, and switches 144 to 146.

The resistor 142 is provided between a non-inverting input terminal of the differential amplifier 141 and a power supply voltage terminal. The constant current source 143 is provided between the non-inverting input terminal of the differential amplifier 141 and a ground voltage terminal. The switch 141 is provided between an output terminal of the differential amplifier 141 and the power supply voltage terminal. The switch 145 is provided between the inverting input terminal and output terminal of the differential amplifier 141. The switch 146 is provided between the inverting input terminal of the differential amplifier 141 and the ground voltage terminal. An output from the output terminal of the differential amplifier 141 serves as an output from the pulse generator 14.

The voltage level of the power supply voltage terminal is $V_{cc}$, the resistance value of the resistor 142 is $R_1$, and the current flowing through the constant current source 143 is $I_1$. The switches 144 to 146 are turned on/off according to the voltage level of a pulse output instruction signal RDIN. When the pulse output instruction signal RDIN is at a high level, the switches 144 and 146 go into an on state and the switch 145 goes into an off state, and the output from the pulse generator 14 at settling time is $V_{cc}$. When the pulse output instruction signal RDIN is at a low level, the switches 144 and 146 go into an off state and the switch 145 goes into an on state, and the output from the pulse generator 14 at settling time is $V_{start}(=V_{cc}-R_1I_1)$.

Figure 5:
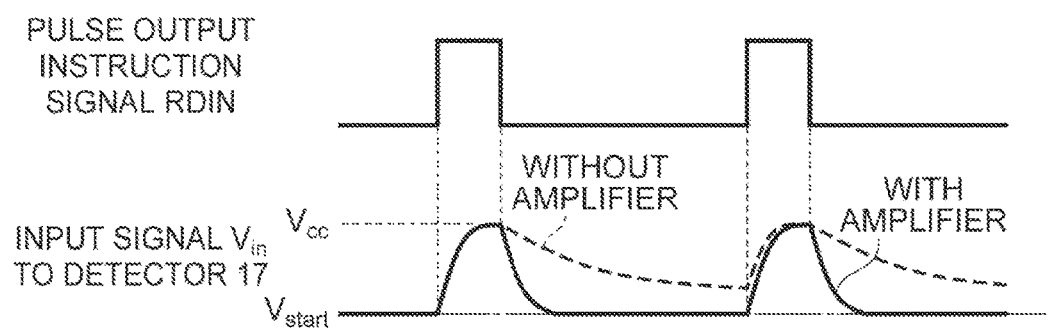
FIG. 5 is a diagram showing changes in the level of a signal inputted to the detector 17 for a case in which the circuit configuration of the pulse generator 14 shown in FIG. 4 is adopted.

FIG. 5 is a diagram showing changes in the level of a signal inputted to the detector 17 for a case in which the circuit configuration of the pulse generator 14 shown in FIG. 4 is adopted. A solid line indicates level changes for the configuration of FIG. 4 in which the differential amplifier 141 is provided, and a dashed line indicates level changes for a configuration in which the differential amplifier 141 is not provided. By adopting the circuit configuration of the pulse generator 14 shown in FIG. 4, the time required for the voltage level of a signal inputted to the detector 17 to be settled to $V_{start}$ from $V_{cc}$ can be reduced.

Figure 6:
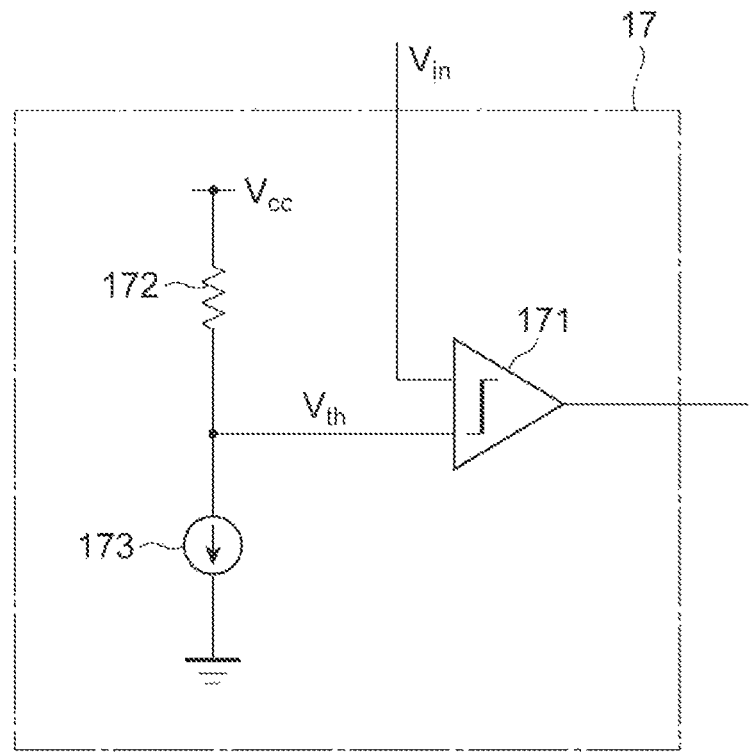
FIG. 6 is a diagram showing an exemplary circuit configuration of the detector 17 of the transmitter 10.

FIG. 6 is a diagram showing an exemplary circuit configuration of the detector 17 of the transmitter 10. The detector 17 includes a comparator 171, a resistor 172, and a constant current source 173.

A voltage $V_{in}$ inputted to a first input terminal of the comparator 171 is the voltage of the differential signal lines 30. The resistor 172 is provided between a second input terminal of the comparator 171 and a power supply voltage terminal. The constant current source 173 is provided between the second input terminal of the comparator 171 and a ground voltage terminal. When the voltage level of the power supply voltage terminal is $V_{cc}$, the resistance value of the resistor 172 is $R_2$, and the current flowing through the constant current source 173 is $I_2$, a voltage $V_{th}$ inputted to the second input terminal of the comparator 171 is $V_{cc}-R_2I_2$.

The comparator 171 compares magnitudes between the input voltage $V_{in}$ and the threshold voltage $V_{th}$. When the input voltage $V_{in}$ is greater than or equal to the threshold voltage $V_{th}$, the comparator 171 outputs a high-level signal. When the input voltage $V_{in}$ is less than the threshold voltage $V_{th}$, the comparator 171 outputs a low-level signal. Timing at which the output signal from the comparator 171 changes from a low level to a high level is timing at which the input voltage $V_{in}$ (the voltage level of a common-mode pulse) exceeds the threshold voltage $V_{th}$.

Next, a possible case will be described in which in the configuration of the transmitter 10 described above, a negative pulse occurs on the differential signal lines 30 upon RX-Detect. When the switch 13 is placed in an off state upon RX-Detect, the output terminals 10a and 10b go into a high-impedance state. If the output terminals 10a and 10b go into a high-impedance state upon the normal operation of the output driver 11, then a negative pulse may occur on the differential signal lines 30, and the negative pulse may destroy devices in the receiver 20.

This event will be described using FIGS. 3, 7, and 8. In the configuration of the output driver 11 shown in FIG. 3, by placing the constant current source 116 in an off state, the output driver 11 can be placed in a power-down state. When the constant current source 116 is placed in an off state, the voltage between the base and emitter of the transistor 113 decreases and the voltages at the bases of the transistors 111 and 112 increase. By this, the current flowing from the collector to emitter of the transistor 112 momentarily increases and accordingly a negative pulse occurs on the differential signal lines 30. Such a phenomenon is likely to occur in an output driver composed of bipolar transistors.

Figure 7:
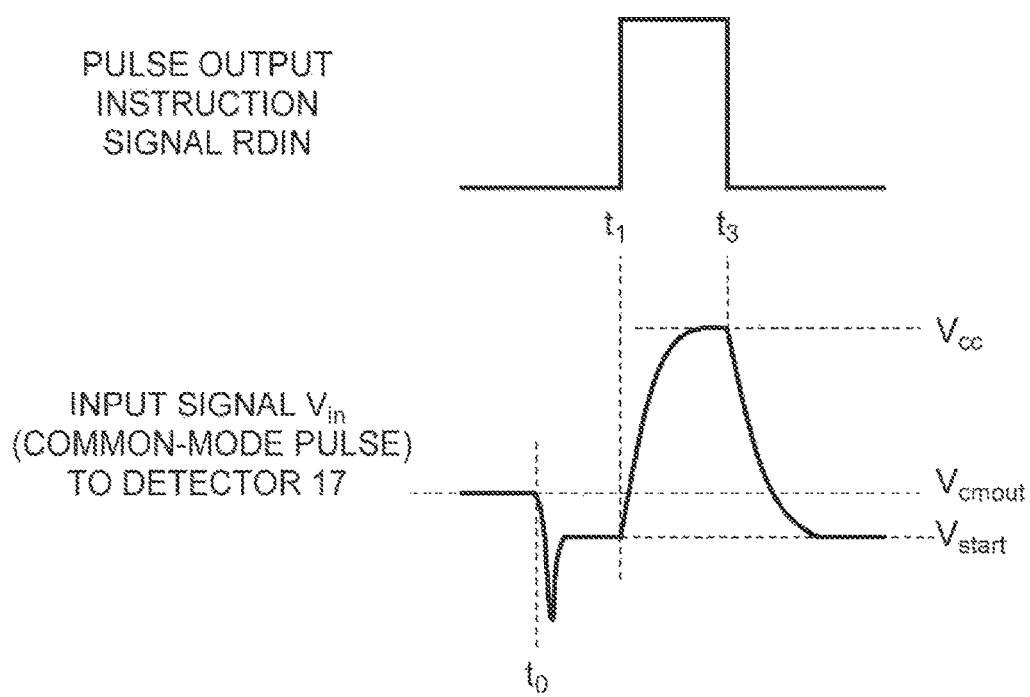
FIG. 7 is a diagram showing changes in the level of a common-mode pulse over time.

FIG. 7 is a diagram showing changes in the level of a common-mode pulse over time. Up until time $t_0$ before time $t_1$ at which generation of a common-mode pulse starts, the output driver 11 is in an operating state and thus the switch 13 is in an on state and the common voltage of the output driver 11 is $V_{cmout}$. When, after the switch 13 is placed in an off state at time $t_0$, the output driver 11 is powered down and the pulse generator 14 is connected to the output terminals 10a and 10b, the voltage on the differential signal lines 30 momentarily reaches a value lower than the low level $V_{start}$ of the common-mode pulse, resulting in a negative pulse. The low level $V_{start}$ of the common-mode pulse is lower than the common voltage $V_{cmout}$ of the output driver 11.

Figure 8:
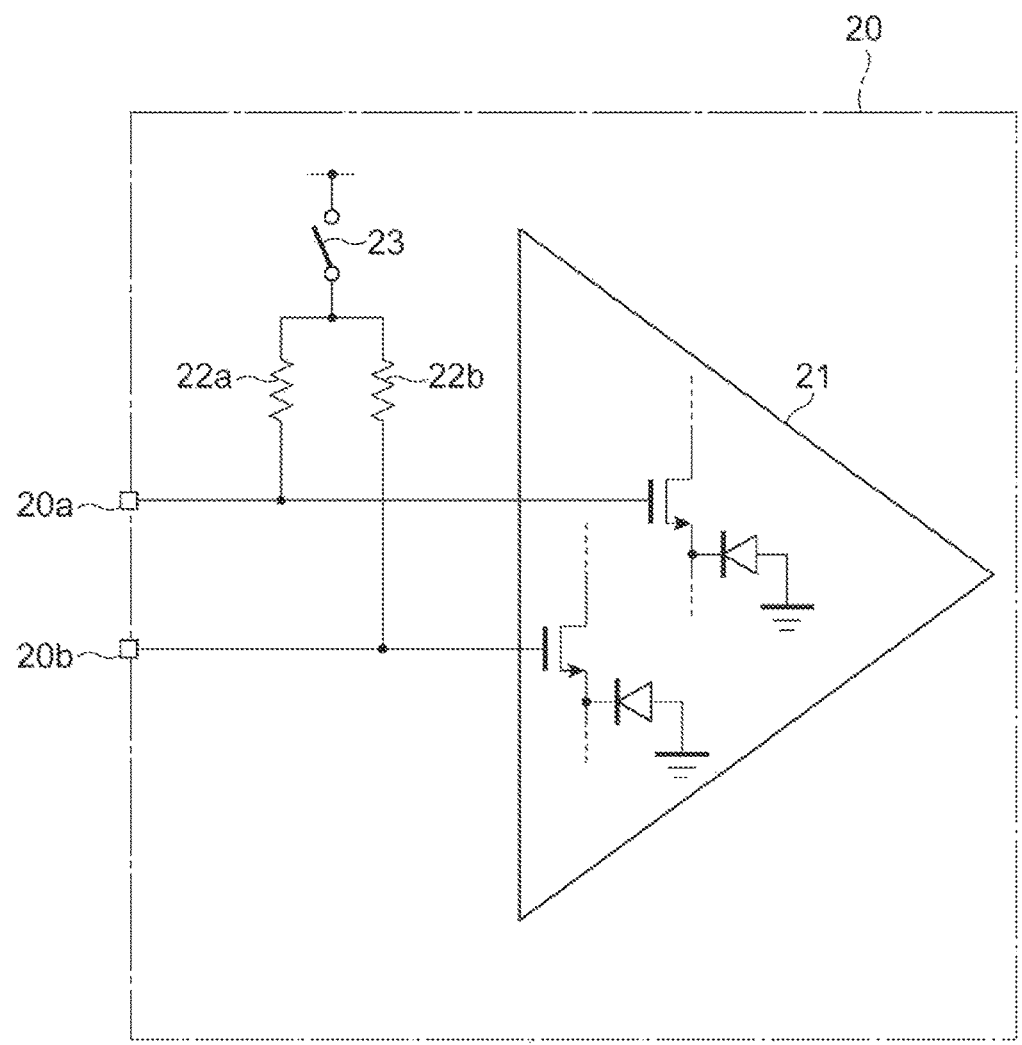
FIG. 8 is a diagram describing the influence of a negative pulse on a receiver 20.

FIG. 8 is a diagram describing the influence of a negative pulse on the receiver 20. The input buffer 21 of the receiver 20 accepts, as input and at the gates of MOS transistors, signals arriving via the differential signal lines 30. Normally, when the input buffer 21 is in a power-down state, the gates of the MOS transistors to which signals are inputted have a ground voltage. When a negative pulse is inputted to the gates of the MOS transistors, parasitic diodes of the MOS transistors go into an on state and accordingly a large current flows, which may destroy the MOS transistors.

Figure 9:
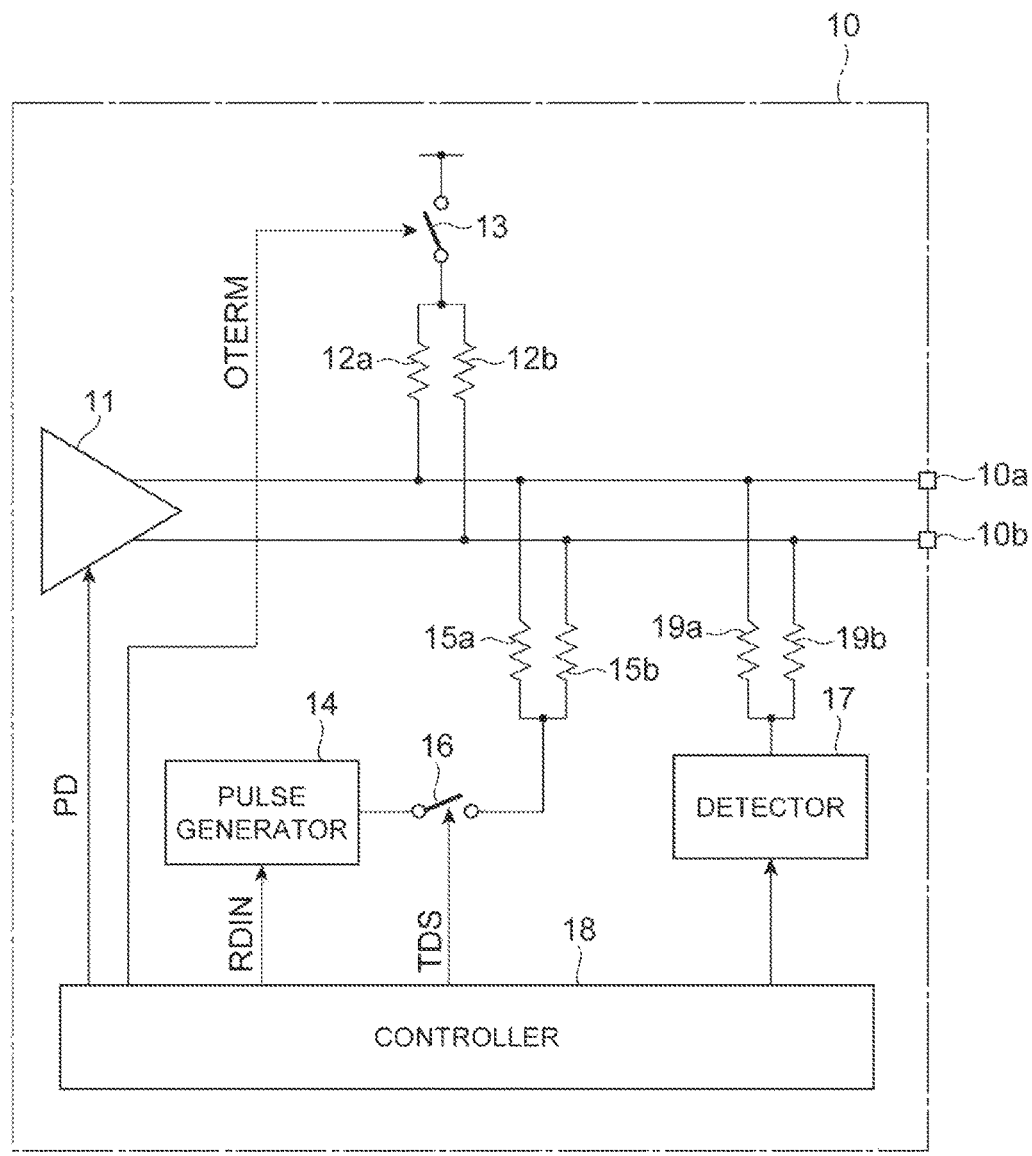
FIG. 9 is a diagram showing a configuration of the transmitter 10 according to an embodiment of the present disclosure.

The transmitter 10 according to the present embodiment which will be described below is a device intended to suppress the occurrence of such a negative pulse. FIG. 9 is a diagram showing a configuration of the transmitter 10 according to the present embodiment. The transmitter 10 includes the output driver 11, the termination resistors 12a and 12b, the switch 13, the pulse generator 14, output resistors 15a and 15b, a switch 16 (second switch), the detector 17, a controller 18, and resistors 19a and 19b. Of these components, the output driver 11, the termination resistors 12a and 12b, the switch 13, the pulse generator 14, and the detector 17 are already described and thus description thereof is omitted here.

The output resistors 15a and 15b and the switch 16 are provided in series between an output terminal of the pulse generator 14 and the differential signal lines 30. Namely, the output resistor 15a and the switch 16 are provided in series between the output terminal of the pulse generator 14 and the first signal line 31a. The output resistor 15b and the switch 16 are provided in series between the output terminal of the pulse generator 14 and the second signal line 31b. The resistors 19a and 19b are provided between the differential signal lines 30 and an input terminal of the detector 17. Namely, the resistor 19a is provided between the first signal line 31a and the input terminal of the detector 17. The resistor 19b is provided between the second signal line 31b and the input terminal of the detector 17.

The controller 18 is a controller configured to control the operation of the transmitter 10. For the controller 18, for example, a processor such as a central processing unit (CPU) or a field programmable gate array (FPGA) is used. The controller 18 outputs an OTERM signal for controlling the on/off of the switch 13. When the OTERM signal is at a high level, the switch 13 is placed in an on state, and when the OTERM signal is at a low level, the switch 13 is placed in an off state. The controller 18 outputs a TDS signal for controlling the on/off of the switch 16. When the TDS signal is at a high level, the switch 16 is placed in an on state, and when the TDS signal is at a low level, the switch 16 is placed in an off state.

The controller 18 outputs a PD signal for controlling the normal operation/power-down of the output driver 11. When the PD signal is at a high level, the output driver 11 is placed in a normal operating state, and when the PD signal is at a low level, the output driver 11 is placed in a power-down state. The controller 18 outputs a pulse output instruction signal RDIN for controlling the generation of a common-mode pulse by the pulse generator 14. The controller 18 controls the operation of the detector 17.

Figure 10:
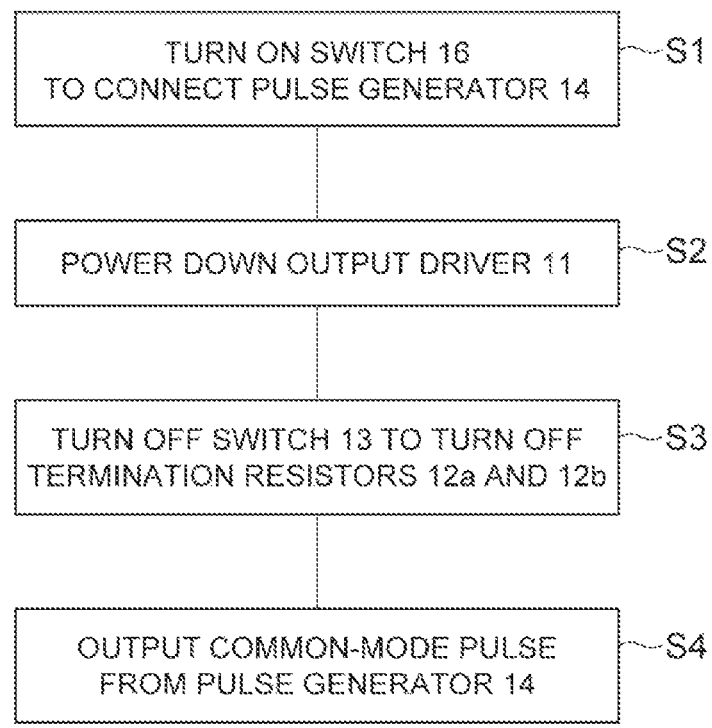
FIG. 10 is a flowchart showing a control sequence which is performed by a controller 18 of the transmitter 10 according to the embodiment upon RX-Detect.
Figure 11:
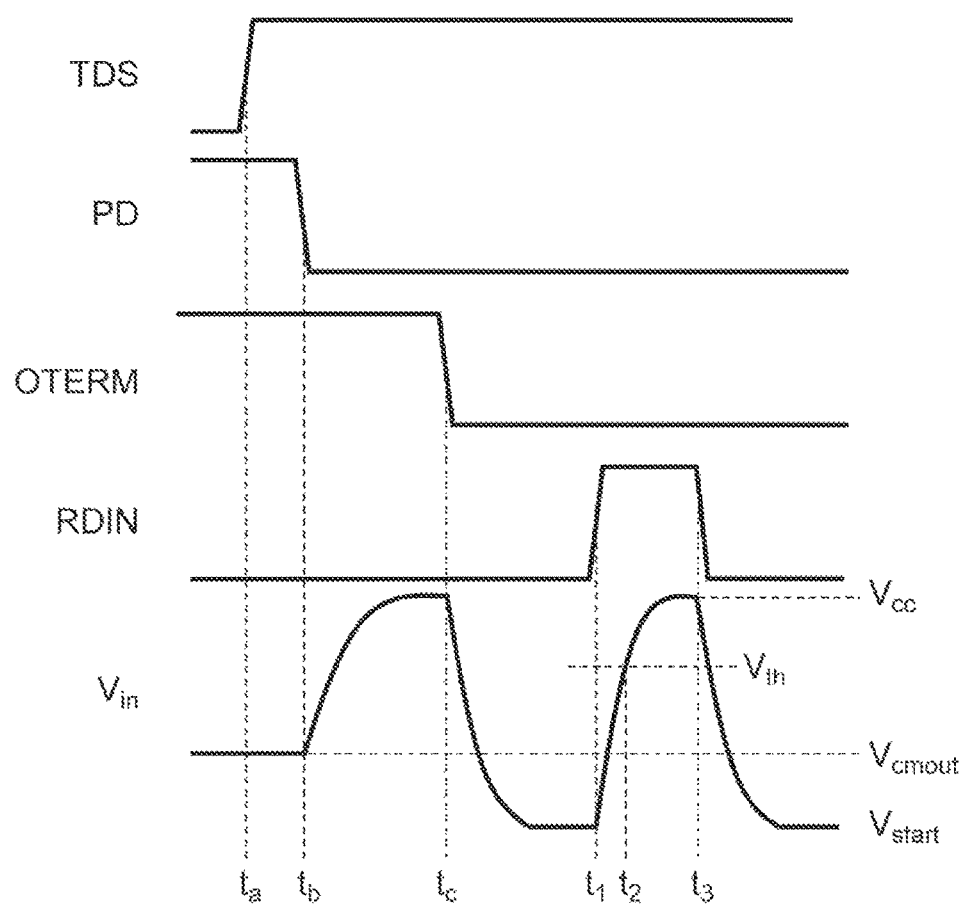
FIG. 11 is a timing chart of signals for the control sequence which is performed by the controller 18 of the transmitter 10 according to the embodiment upon RX-Detect.

FIG. 10 is a flowchart showing a control sequence which is performed by the controller 18 of the transmitter 10 according to the present embodiment upon RX-Detect. FIG. 11 is a timing chart of signals for the control sequence which is performed by the controller 18 of the transmitter 10 according to the present embodiment upon RX-Detect.

At time $t_a$, the controller 18 changes the TDS signal from a low level to a high level to place the switch 16 in an on state, by which the pulse generator 14 is connected to the differential signal lines 30 (step S1). At time $t_b$ after time $t_a$, the controller 18 changes the PD signal from a high level to a low level to power down the output driver 11 (step S2).

At time $t_c$ after time $t_b$, the controller 18 changes the OTERM signal from a high level to a low level to place the switch 13 in an off state, by which the termination resistors 12a and 12b are placed in an off state (step S3). Then, at time $t_1$ after time $t_c$, the controller 18 changes the pulse output instruction signal RDIN from a low level to a high level to allow the pulse generator 14 to output a common-mode pulse to the differential signal lines 30 (step S4).

Note that in order for the detector 17 to securely detect, after time $t_1$ at which generation of a common-mode pulse starts, time $t_2$ at which the voltage level of the common-mode pulse exceeds the threshold $V_{th}$, it is preferred that the voltage level of the common-mode pulse not have an abrupt rise. To do so, it is preferred that the resistance values of the output resistors 15a and 15b be relatively high. In order also to suppress deterioration of high-frequency characteristics which is caused by the influence of the parasitic capacitance of the switch 16, it is preferred that the resistance values of the output resistors 15a and 15b be relatively high. The resistance values of the output resistors 15a and 15b may be, for example, several kΩ.

On the other hand, the resistance values of the termination resistors 12a and 12b may be, for example, 45Ω. When the switch 13 is in an on state upon the generation of a common-mode pulse, the amplitude of the common-mode pulse is divided by the termination resistors 12a and 12b and the output resistors 15a and 15b and thus is reduced. For this reason, the switch 13 is placed in an off state upon the generation of a common-mode pulse.

The transmitter 10 according to the present embodiment can suppress the occurrence of a negative pulse by performing, upon RX-Detect, a control sequence such as that described above and thus can suppress the destruction of devices in the receiver 20 caused by the negative pulse.

What is claimed is:

1. A transmitter that transmits differential signals to a receiver via differential signal lines having AC coupling capacitors provided in middle of the differential signal lines, the transmitter comprising:
   an output driver configured to output the differential signals to the differential signal lines;
   first termination resistors and a first switch, the first termination resistors and the first switch being provided in series between a first reference voltage input terminal and the differential signal lines, a reference voltage being inputted to the first reference voltage input terminal;
   a pulse generator configured to output a common-mode pulse to the differential signal lines;
   a second switch provided between the differential signal lines and the pulse generator;
   a detector configured to detect, after generation of the common-mode pulse starts, timing at which a voltage level of the common-mode pulse exceeds a threshold; and
   a controller configured to place the second switch in an on state to connect the pulse generator to the differential signal lines, and power down the output driver and then place the first switch in an off state to allow the pulse generator to output the common-mode pulse to the differential signal lines.

2. The transmitter according to claim 1, wherein the detector is connected to only either one of the differential signal lines and detects, after generation of the common-mode pulse starts, timing at which a voltage level of a pulse on the either one of the differential signal lines exceeds the threshold.

3. A transmission/reception system comprising:

the transmitter according to claim 1; and a receiver connected to the transmitter by the differential signal lines, wherein the receiver includes: an input buffer configured to accept, as input, differential signals arriving from the transmitter via the differential signal lines; and second termination resistors and a third switch, the second termination resistors and the third switch being provided in series between a second reference voltage input terminal and the differential signal lines, a reference voltage being inputted to the second reference voltage input terminal.

* * * * *